(12) United States Patent
Tel et al.

(10) Patent No.: US 11,029,614 B2
(45) Date of Patent: Jun. 8, 2021

(54) LEVEL SENSOR APPARATUS, METHOD OF MEASURING TOPOGRAPHICAL VARIATION ACROSS A SUBSTRATE, METHOD OF MEASURING VARIATION OF A PHYSICAL PARAMETER RELATED TO A LITHOGRAPHIC PROCESS, AND LITHOGRAPHIC APPARATUS

(71) Applicant: ASML NETHERLANDS B.V., Veldhoven (NL)

(72) Inventors: Wim Tjibbo Tel, Helmond (NL); Frank Staals, Eindhoven (NL); Martin Jules Marie-Emile De Nivelle, Waalre (NL); Tanbir Hasan, San Jose, CA (US)

(73) Assignee: ASML Netherlands B.V., Veldhoven (NL)

( * ) Notice: Subject to any disclaimer, the term of this patent is extended or adjusted under 35 U.S.C. 154(b) by 29 days.

(21) Appl. No.: 16/318,388

(22) PCT Filed: Jun. 22, 2017

(86) PCT No.: PCT/EP2017/065448
§ 371 (c)(1),
(2) Date: Jan. 17, 2019

(87) PCT Pub. No.: WO2018/019496
PCT Pub. Date: Feb. 1, 2018

(65) Prior Publication Data
US 2019/0243259 A1    Aug. 8, 2019

Related U.S. Application Data

(60) Provisional application No. 62/434,254, filed on Dec. 14, 2016, provisional application No. 62/367,023, filed on Jul. 26, 2016.

(51) Int. Cl.
*G05B 19/4097* (2006.01)
*G03F 9/00* (2006.01)

(52) U.S. Cl.
CPC ....... *G03F 9/7034* (2013.01); *G05B 19/4097* (2013.01); *G05B 2219/45028* (2013.01); *G05B 2219/45031* (2013.01)

(58) Field of Classification Search
CPC .............. G03F 9/7034; G05B 19/4097; G05B 2219/45028; G05B 2219/45031
See application file for complete search history.

(56) References Cited

U.S. PATENT DOCUMENTS

| 7,265,364 B2 | 9/2007 | Teunissen et al. | |
| 7,355,709 B1 * | 4/2008 | Bevis ..................... | G01B 11/24 356/390 |

(Continued)

FOREIGN PATENT DOCUMENTS

| CN | 103186057 | 7/2013 |
| EP | 2317388 | 5/2011 |

(Continued)

OTHER PUBLICATIONS

International Search Report and Written Opinion issued in corresponding PCT Patent Application No. PCT/EP2017/065448, dated Jul. 25, 2016.

(Continued)

*Primary Examiner* — Yuhui R Pan
(74) *Attorney, Agent, or Firm* — Pillsbury Winthrop Shaw Pittman LLP

(57) ABSTRACT

A method of determining topographical variation across a substrate on which one or more patterns have been applied. The method includes obtaining measured topography data representing a topographical variation across a substrate on which one or more patterns have been applied by a litho- (Continued)

graphic process; and combining the measured topography data with knowledge relating to intra-die topology to obtain derived topography data having a resolution greater than the resolution of the measured topography data. Also disclosed is a corresponding level sensor apparatus and lithographic apparatus having such a level sensor apparatus, and a more general method of determining variation of a physical parameter from first measurement data of variation of the physical parameter across the substrate and intra-die measurement data of higher resolution than the first measurement data and combining these.

20 Claims, 5 Drawing Sheets

(56) References Cited

U.S. PATENT DOCUMENTS

| | | | |
|---|---|---|---|
| 2002/0126732 A1* | 9/2002 | Shakouri | G01J 5/00 |
| | | | 374/130 |
| 2002/0192578 A1 | 12/2002 | Tanaka et al. | |
| 2005/0224725 A1 | 10/2005 | Menon et al. | |
| 2005/0259272 A1* | 11/2005 | Wang | G01B 11/0608 |
| | | | 356/601 |
| 2007/0139633 A1 | 6/2007 | Bleeker et al. | |
| 2009/0262320 A1* | 10/2009 | Staals | G03F 9/7003 |
| | | | 355/55 |
| 2010/0233600 A1 | 9/2010 | Den Boef et al. | |
| 2011/0205540 A1* | 8/2011 | Moll | G01B 11/0625 |
| | | | 356/369 |
| 2013/0128247 A1 | 5/2013 | Khuat Duy et al. | |
| 2013/0215404 A1 | 8/2013 | Den Boef | |
| 2014/0175672 A1* | 6/2014 | Choi | H01L 24/80 |
| 2014/0198185 A1* | 7/2014 | Haugen | G01B 11/2545 |
| | | | 348/48 |
| 2014/0278213 A1 | 9/2014 | Hsieh et al. | |
| 2016/0161863 A1 | 6/2016 | Den Boef et al. | |
| 2017/0363969 A1 | 12/2017 | Hauptmann et al. | |

FOREIGN PATENT DOCUMENTS

| | | | |
|---|---|---|---|
| TW | 201621472 | 6/2016 | |
| WO | 200734829 | 9/2007 | |
| WO | 2009060294 | 5/2009 | |
| WO | 2015131969 | 9/2015 | |
| WO | WO-2015131969 A1 * | 9/2015 | G03F 9/7092 |
| WO | 2017045871 | 3/2017 | |
| WO | 2017063789 | 4/2017 | |

OTHER PUBLICATIONS

Taiwanese Office Action issued in corresponding Taiwanese Patent Application No. 106123141, dated Mar. 29, 2018.

Taiwanese Office Action issued in corresponding Taiwanese Patent Application No. 107140119, dated Aug. 8, 2019.

Korean Office Action issued in corresponding Korean Patent Application No. 10-2019-7005626, dated Jul. 3, 2020.

* cited by examiner

LEVEL SENSOR APPARATUS, METHOD OF MEASURING TOPOGRAPHICAL VARIATION ACROSS A SUBSTRATE, METHOD OF MEASURING VARIATION OF A PHYSICAL PARAMETER RELATED TO A LITHOGRAPHIC PROCESS, AND LITHOGRAPHIC APPARATUS

CROSS-REFERENCE TO RELATED APPLICATIONS

This application is the U.S. national phase entry of PCT patent application no. PCT/EP2017/065448, which was filed on Jun. 22, 2017, which claims the benefit of priority of U.S. provisional patent application No. 62/367,023, which was filed on Jul. 26, 2016, and U.S. provisional patent application No. 62/434,254, which was filed on Dec. 14, 2016, each of which is are incorporated herein in its entirety by reference.

FIELD

The present disclosure relates to lithographic apparatus, and more specifically to measuring the topography of a processed substrate using a level sensor, and to measuring variation of a physical parameter related to a lithographic process.

BACKGROUND

A lithographic apparatus is a machine that applies a desired pattern onto a substrate, usually onto a target portion of the substrate. A lithographic apparatus can be used, for example, in the manufacture of integrated circuits (ICs). In that instance, a patterning device, which is alternatively referred to as a mask or a reticle, may be used to generate a circuit pattern to be formed on an individual layer of the IC. This pattern can be transferred onto a target portion (e.g., comprising part of, one, or several dies) on a substrate (e.g., a silicon wafer). Transfer of the pattern is typically via imaging onto a layer of radiation-sensitive material (resist) provided on the substrate. In general, a single substrate will contain a grid of adjacent target portions referred to as "fields" that are successively patterned. Known lithographic apparatus include so-called steppers, in which each field is irradiated by exposing an entire field pattern onto the field at one time, and so-called scanners, in which each field is irradiated by scanning the field pattern through a radiation beam in a given direction (the "scanning"-direction) while synchronously scanning the substrate parallel or anti-parallel to this direction.

SUMMARY

In order to accurately predict defects in a pattern applied using a lithography process, topography characterization is used. This is particularly the case for back end layers and vertically integrated products (e.g., 3D-NAND), where more within-die topography can be expected. In order to predict the locations where defects may occur, a hybrid dense focus map can be used to predict defects, combining a global focus fingerprint and on-product levelling data.

In order to measure the surface topography of a patterned substrate (e.g., after polishing) to an accuracy sufficient for accurate defect prediction, micro-topography measurement is performed on production substrates at a spatial frequency of approximately 10-100 μm. The actual magnitude of the micro-topography may vary significantly with product, layer and chemical mechanical polishing (CMP) strategy. Measurement may be performed using specialist metrology tools, such as (interferometric) optical surface profilers. However, these are very slow and their measurements may be highly process dependent (i.e., highly dependent on the properties of the surface being measured). To remove this process dependency, a metal layer may be applied to the substrate before measurement; however this effectively destroys the substrate, meaning that such micro-topography measurements are destructive measurements.

It would be desirable, for example, to provide faster, non-destructive measurement of the surface topography of a patterned substrate.

In an aspect, there is provided a method of determining topographical variation across a substrate on which one or more patterns have been applied, the method comprising: obtaining measured topography data representing a topographical variation across a substrate on which one or more patterns have been applied by a lithographic process; and combining the measured topography data with knowledge relating to intra-die topology to obtain derived topography data having a resolution greater than the resolution of the measured topography data.

In an aspect, there is provided a level sensor apparatus comprising a first measurement system operable to measure topographical variation across a substrate on which one or more patterns have been applied to obtain measured topography data; and a processor system operable to combine the measured topography data with knowledge relating to intra-die topology to obtain derived topography data having a resolution greater than that of the first measurement system.

In an aspect, there is provided a method of determining variation of a physical parameter relating to patterns having been applied to a substrate by a lithographic process, the method comprising: obtaining first measurement data of the variation of a physical parameter across a substrate on which one or more patterns have been applied by a lithographic process; obtaining second measurement data, wherein the second measurement data comprising intra-die measurement data of higher resolution than the first measurement data, and wherein the second measurement data is referenced to reference measurement data having a common frame of reference with the first measurement data; and combining the first measurement data with the second measurement data to obtain derived measurement data having a resolution greater than the resolution of the first measurement data.

In aspect, there is provided a computer program product comprising machine readable instructions for causing a general purpose data processing apparatus to perform a method as described herein. The computer program product may comprise a non-transitory storage medium.

Further features and advantages, as well as the structure and operation of various embodiments, are described in detail below with reference to the accompanying drawings. It is noted that the invention is not limited to the specific embodiments described herein. Such embodiments are presented herein for illustrative purposes only. Additional embodiments will be apparent to persons skilled in the relevant art(s) based on the teachings contained herein.

BRIEF DESCRIPTION OF THE DRAWINGS

Embodiments will now be described, by way of example only, with reference to the accompanying schematic drawings in which.

DETAILED DESCRIPTION

Figure 1:
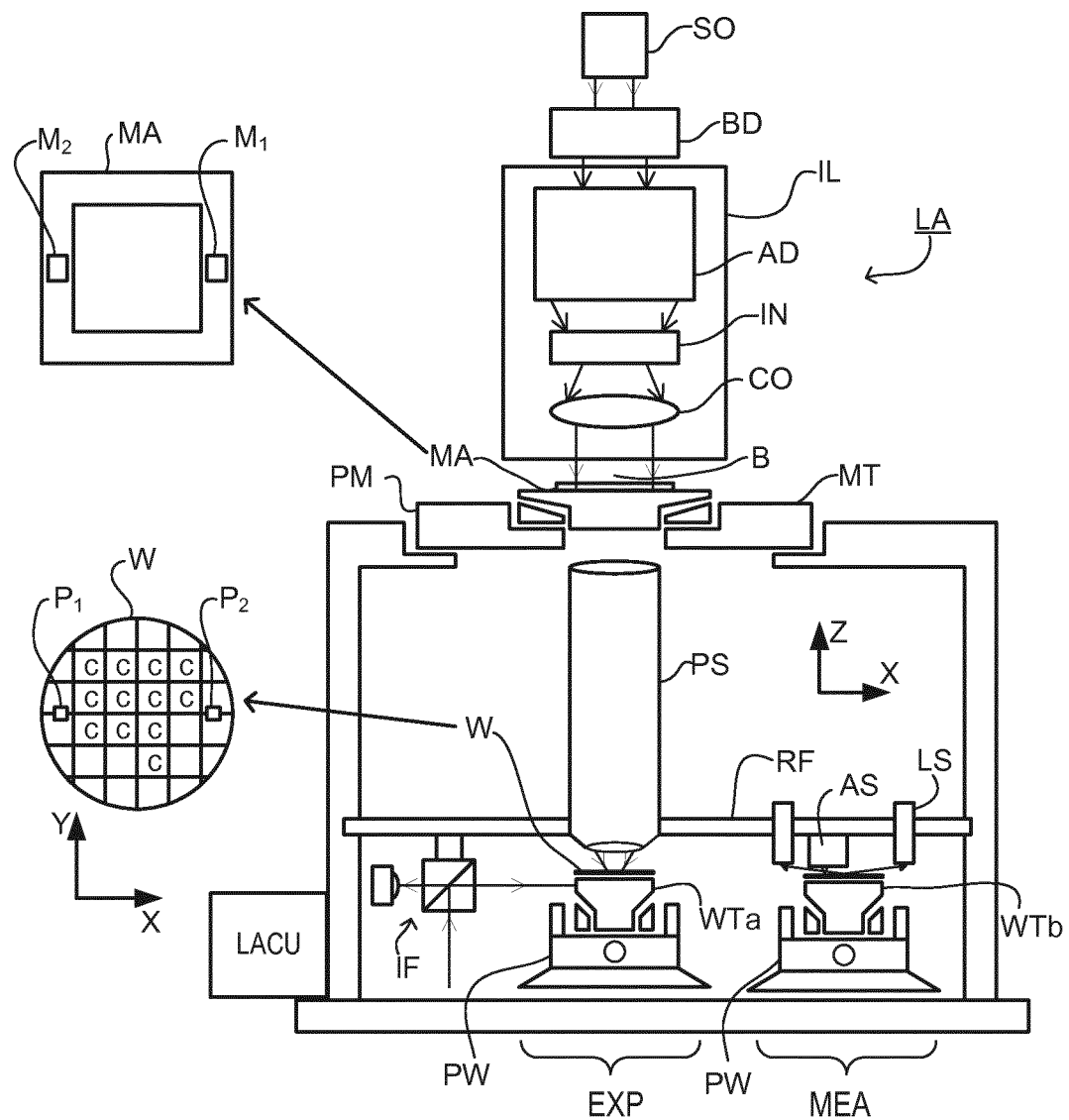
FIG. 1 depicts a lithographic apparatus according to an embodiment.

FIG. 1 schematically depicts a lithographic apparatus LA. The apparatus comprises:

an illumination system (illuminator) IL configured to condition a radiation beam B (e.g. UV radiation or EUV radiation).

a support structure (e.g. a mask table) MT constructed to support a patterning device (e.g. a mask or reticle) MA and connected to a first positioner PM configured to accurately position the patterning device in accordance with certain parameters;

a substrate table (e.g. a wafer table) WTa or WTb constructed to hold a substrate (e.g. a resist coated wafer) W and connected to a second positioner PW configured to accurately position the substrate in accordance with certain parameters; and a projection system (e.g. a refractive projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure holds the patterning device in a manner that depends on the orientation of the patterning device, the design of the lithographic apparatus, and other conditions, such as for example whether or not the patterning device is held in a vacuum environment. The support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device (or a number of devices) being created in the target portion, such as an integrated circuit. The patterning device may be transmissive or reflective. Examples of patterning devices include masks, programmable mirror arrays, and programmable LCD panels.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques are well known in the art for increasing the numerical aperture of projection systems. The term "immersion" as used herein does not mean that a structure, such as a substrate, must be submerged in liquid, but rather only means that liquid is located between the projection system and the substrate during exposure.

Illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD comprising, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may comprise an adjuster AD for adjusting the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may comprise various other components, such as an integrator IN and a condenser CO. The illuminator may be used to condition the radiation beam, to have a desired uniformity and intensity distribution in its cross section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF (e.g. an interferometric device, linear encoder or capacitive sensor), the substrate table WTa/WTb can be moved accurately, e.g. so as to position different target portions C in the path of the radiation beam B. Similarly, the first positioner PM and another position sensor (which is not explicitly depicted in FIG. 1) can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WTa/WTb may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (fields), and/or between device areas (dies) within target portions. These are known as scribe-lane alignment marks, because individual product dies will eventually be cut from one another by scribing along these lines. Similarly, in situations in which more than one die is provided on the patterning device MA, the patterning device alignment marks may be located between the dies.

The depicted apparatus could be used in at least one of the following modes:

1. In step mode, the support structure MT and the substrate table WTa/WTb are kept essentially stationary, while an entire pattern imparted to the radiation beam is projected onto a target portion C at one time (i.e. a single static exposure). The substrate table WTa/WTb is then shifted in the X and/or Y direction so that a different target portion C can be exposed. In step mode, the maximum size of the exposure field limits the size of the target portion C imaged in a single static exposure.

2. In scan mode, the support structure MT and the substrate table WTa/WTb are scanned synchronously while a pattern imparted to the radiation beam is projected onto a target portion C (i.e. a single dynamic exposure). The velocity and direction of the substrate table WTa/WTb relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WTa/WTb is moved or scanned while a pattern imparted to the radiation beam is projected onto a target portion C. In this mode, generally a pulsed radiation source is employed and the programmable patterning device is updated as required after each movement of the substrate table WTa/WTb or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Lithographic apparatus LA in this example is of a so-called dual stage type which has two substrate tables WTa and WTb and two stations—an exposure station and a measurement station—between which the substrate tables can be exchanged. While one substrate on one substrate table is being exposed at the exposure station EXP, another substrate can be loaded onto the other substrate table at the measurement station MEA so that various preparatory steps may be carried out. The preparatory steps may include mapping the surface height of the substrate using a height sensor LS and/or measuring the position of alignment marks on the substrate using an alignment sensor AS. The measurement is time-consuming and the provision of two substrate tables enables a substantial increase in the throughput of the apparatus. If the position sensor IF is not capable of measuring the position of the substrate table while it is at the measurement station as well as at the exposure station, a second position sensor may be provided to enable the positions of the substrate table to be tracked at both stations.

The apparatus further includes a lithographic apparatus control unit LACU which controls all the movements and measurements of the various actuators and sensors described. LACU also includes signal processing and data processing capacity to implement desired calculations relevant to the operation of the apparatus. In practice, control unit LACU will be realized as a system of many sub-units, each handling the real-time data acquisition, processing and control of a subsystem or component within the apparatus. For example, one processing subsystem may be dedicated to servo control of the substrate positioner PW. Separate units may even handle coarse and fine actuators, or different axes. Another unit might be dedicated to the readout of the position sensor IF. Overall control of the apparatus may be controlled by a central processing unit, communicating with these sub-systems processing units, with operators and with other apparatuses involved in the lithographic manufacturing process.

Figure 2:
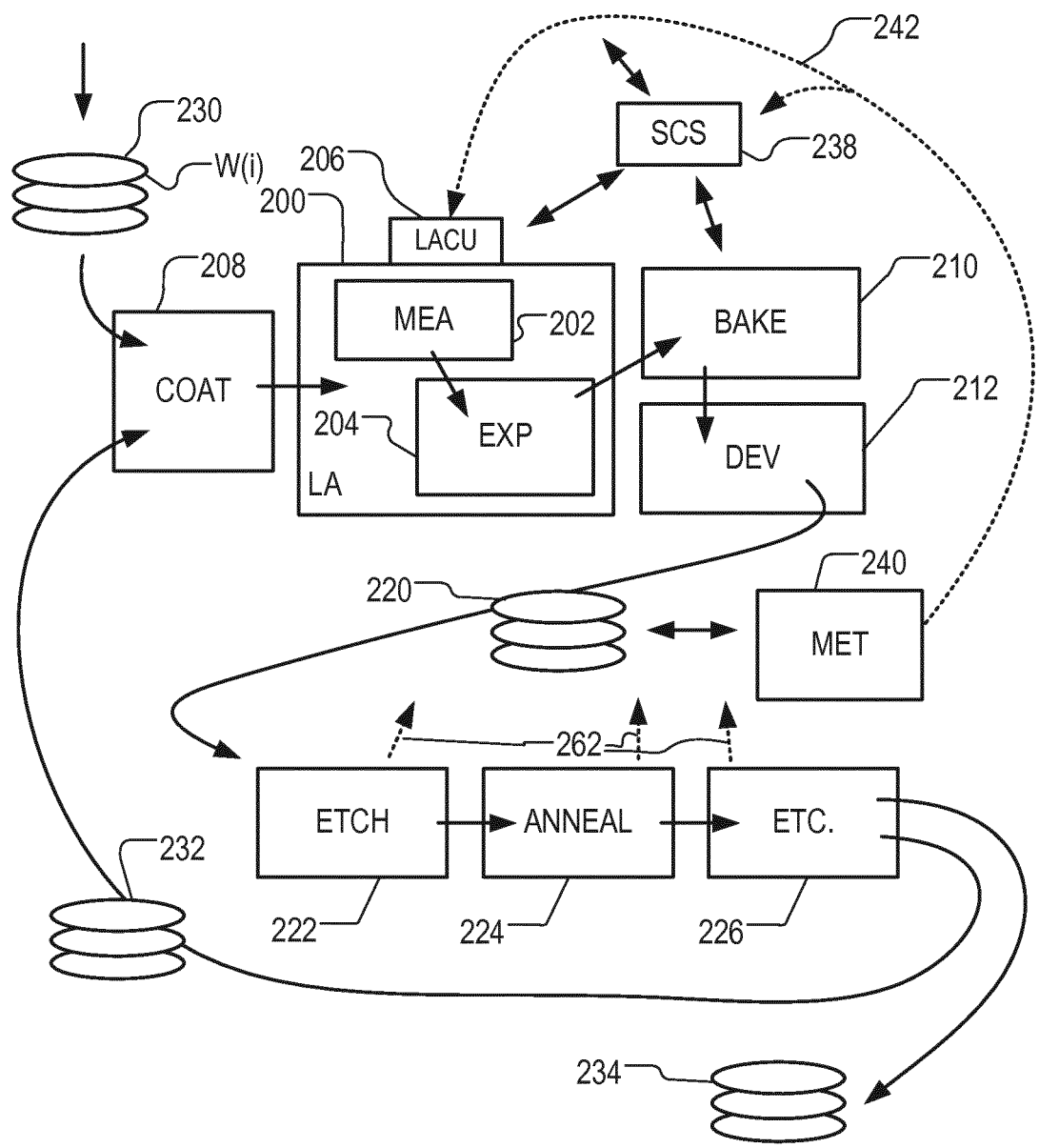
FIG. 2 shows schematically the use of the lithographic apparatus of FIG. 1 together with other apparatuses forming a production facility for devices (such as semiconductor devices)

FIG. 2 at 200 shows the lithographic apparatus LA in the context of an embodiment of an industrial production facility for devices (e.g., semiconductor products). Within the lithographic apparatus (or "litho tool" 200 for short), the measurement station MEA is shown at 202 and the exposure station EXP is shown at 204. The control unit LACU is shown at 206. Within the production facility, apparatus 200 forms part of a "litho cell" or "litho cluster" that includes, for example, a coating apparatus 208 to apply photosensitive resist and/or another coating to substrate W for patterning by the apparatus 200. At the output side of apparatus 200, a baking apparatus 210 can be provided and/or a developing apparatus 212 can be provided to develop the exposed pattern into a physical resist pattern.

Once the pattern has been applied and developed, patterned substrates 220 are transferred to one or more other processing apparatuses such as are illustrated at 222, 224, 226. A wide range of processing steps can be implemented by various apparatuses in a typical manufacturing facility. For the sake of example, apparatus 222 in this embodiment is an etching station, and apparatus 224 performs a post-etch annealing step. Further physical and/or chemical processing steps are applied in further apparatuses, 226, etc. Numerous types of operation can be used to make a real device, such as deposition of material, modification of one or more surface material characteristics (oxidation, doping, ion implantation etc.), chemical-mechanical polishing (CMP), and so forth. The apparatus 226 may, in practice, represent a series of different processing steps performed in one or more apparatuses.

The manufacture of semiconductor devices often involves many repetitions of such processing, to build up device structures with appropriate materials and patterns, layer-by-layer on the substrate. Accordingly, substrates 230 arriving at the litho cluster may be newly prepared substrates, or they may be substrates that have been processed previously in this cluster or in another apparatus entirely. Similarly, depending on the required processing, substrates 232 on leaving apparatus 226 may be returned for a subsequent patterning operation in the same litho cluster, they may be destined for patterning operations in a different cluster 234, or they may be finished products 234 to be sent for dicing and packaging.

Each layer of the product structure typically involves a different set of process steps, and the apparatuses 226 used at each layer may be completely different in type. Moreover, different layers often involves different etch processes, for example chemical etches, plasma etches, according to the details of the material to be etched, and special requirements such as, for example, anisotropic etching.

The previous and/or subsequent processes may be performed in other lithography apparatuses, as just mentioned, and may even be performed in different types of lithography apparatus. For example, some layers in the device manufacturing process which are very demanding in parameters such as resolution and overlay may be performed in a more advanced lithography tool than other layers that are less demanding. Therefore some layers may be exposed in an immersion type lithography tool, while others are exposed in a 'dry' tool. Some layers may be exposed in a tool working at DUV wavelengths, while others are exposed using EUV wavelength radiation.

The whole facility may be operated under control of a supervisory control system 238, which receives metrology data, design data, process recipes and the like. Supervisory control system 238 issues commands to each of the apparatuses to implement the manufacturing process on one or more batches of substrates.

Also shown in FIG. 2 is a metrology apparatus 240 which is provided for making measurements of parameters of the products at desired stages in the manufacturing process. A common example of a metrology apparatus in a modern lithographic production facility is a scatterometer, for example an angle-resolved scatterometer or a spectroscopic scatterometer, and it may be applied to measure one or more properties of the developed substrates at 220, for example prior to etching in the apparatus 222. Using metrology apparatus 240, it may be determined, for example, that one or more important performance parameters such as overlay or critical dimension (CD) do not meet specified accuracy requirements in the developed resist. Prior to the etching step, the opportunity exists to strip the developed resist and reprocess the substrates 220 through the litho cluster. The metrology results 242 from the metrology apparatus 240 can be used to maintain accurate performance of the patterning operations in the litho cluster, by control unit LACU 206 making small adjustments over time, thereby minimizing the risk of products being made out-of-specification, and requiring re-work. Of course, metrology apparatus 240 and/or other metrology apparatuses (not shown) can be applied to measure properties of the processed substrates 232, 234, and incoming substrates 230.

When imaging a pattern onto the substrate it is desirable to ensure that an uppermost surface of the substrate (i.e. the surface onto which the pattern is to be imaged) lies within the focal plane of the projection system. The surface of a substrate on which a pattern should be projected is never perfectly flat, but presents many height deviations on both a large scale and smaller scale. Failure to adjust the focus of the projection system and/or positioning of the substrate relative to the focus of the projection system may result in poor patterning performance and consequently poor performance of the manufacturing process as a whole. One or more performance parameters, such as critical dimension (CD) and/or CD uniformity in particular, can be degraded by poor focus.

To measure these height deviations, one or more level sensors (or one or more height sensors) may be integrated in the lithographic apparatus. A level or height sensor is typically an optical sensor used to measure the vertical position of the uppermost surface of the substrate at points all across the substrate, after it has been loaded into the lithographic apparatus. This set of measurements is stored in some suitable form and may be referred to as a "height map". The height map is then used when controlling imaging of the pattern onto the substrate, to ensure that the radiation sensitive resist layer on each portion of the substrate lies in the focal plane of the projection system. Typically the height of a substrate support bearing the substrate will be adjusted continuously during exposure of successive portions on a substrate. Examples of level sensors are disclosed in U.S. Pat. No. 7,265,364, United States Patent Application Publication No. US 2010-0233600 and United States Patent Application Publication No. US 2013-128247, each of which are herein incorporated by reference in its entirety.

It is proposed that a level sensor, such as that illustrated in FIG. 1 or FIG. 3 (described below) and as may be typically installed on current lithographic apparatuses, is used to perform measurement of a topographical variation across the substrate surface after a patterning step (and, for example, after a polishing step). This has an advantage of using hardware already in place. Also, an ultraviolet-based level sensor (i.e., which uses ultraviolet radiation to perform the level sensing measurements) has a very low process dependency. However, the resolution of such a level sensor is low, with a typical level sensor measurement grid element being in the region of 1 mm×0.5 mm. This is limited further in the Y direction by the level sensor spot size in this direction, resulting in an effective resolution in the region of 1 mm×2 mm. Consequently, product measurements using a level sensor will tend to be very blurred.

To compensate for the low resolution of the level sensor, it is proposed to use knowledge relating to intra-die topology, which in this embodiment may comprise positional information of the one or more applied patterns (i.e., information of the layout of the applied pattern), to interpret the low resolution measurements. The knowledge of location and size of specific areas of one or more patterns applied to the substrate (for example, from a reticle data file) may be used in order to reconstruct the height per area at higher resolution than is possible with the level sensor alone. In an embodiment, one or more deconvolution techniques may be used to obtain a higher resolution map from the known layout information and the low resolution measurement data.

Figure 3A:
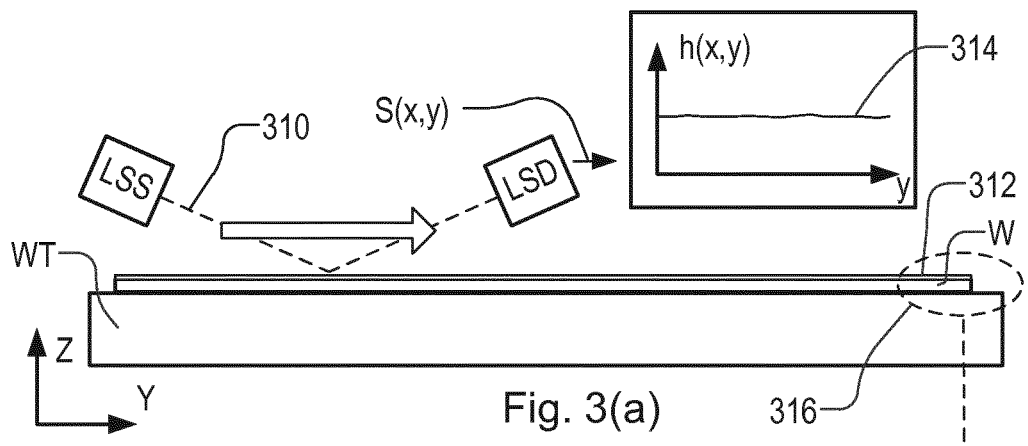
FIG. 3(a) illustrates schematically the operation of a level sensor according to an embodiment.

FIG. 3 illustrates a step of obtaining measured topography data by measuring surface position in the Z direction against X-Y position. This topography data may be obtained for example using the level sensor LS in the lithographic apparatus of FIG. 1, after the substrate has been clamped to one of the substrate supports WTa and WTb, following patterning and polishing steps, for example. FIG. 3(a) shows a substrate support WT, and carries a substrate W. The level sensor LS is in this example an optical sensor, comprising a source side optics LSS, and detector optics LSD.

In operation, source side optics LSS provides one or more beams of radiation (light) 310 that impinge onto a substrate W. Substrate W typically has different layers formed on it, and typically many more layers than are illustrated here. The beam of radiation 310 is reflected by the substrate and detected by detector side optics LSD to obtain one or more signals S(x,y) from which a surface height at a position (x,y) on the substrate may be derived. Typically, the level sensor generates a plurality of beams of radiation (between 5 and 100 for example) which simultaneously impinge on the level sensor surface, forming a (e.g., 1-dimensional) array of measurement spots on the substrate W. By measuring the surface height at numerous positions across the substrate, a height map h(x,y) can be obtained by a suitable processor system in control unit LACU.

The details of these optics for height sensing, as well as the associated signal processing, are known in the art and described for example in the prior publications mentioned in the introduction. They will not be described herein in detail. The radiation used in the present examples may be monochromatic, polychromatic and/or broadband. It may be P- or S-polarized, circularly polarized and/or unpolarized. In a specific example, the radiation comprises ultraviolet radiation. The height map h(x,y) can take any suitable form. In a simple embodiment, the height map comprises a two-dimensional array of sample values indexed by the X and Y coordinates of position across the substrate. In other embodiments, the height values could be expressed by parametric curves, fitted to measured sample values. A graph 314 of h(x,y) in FIG. 3 represents height values in a single slice, for example extending in the Y direction with a certain X value.

Figure 3B:
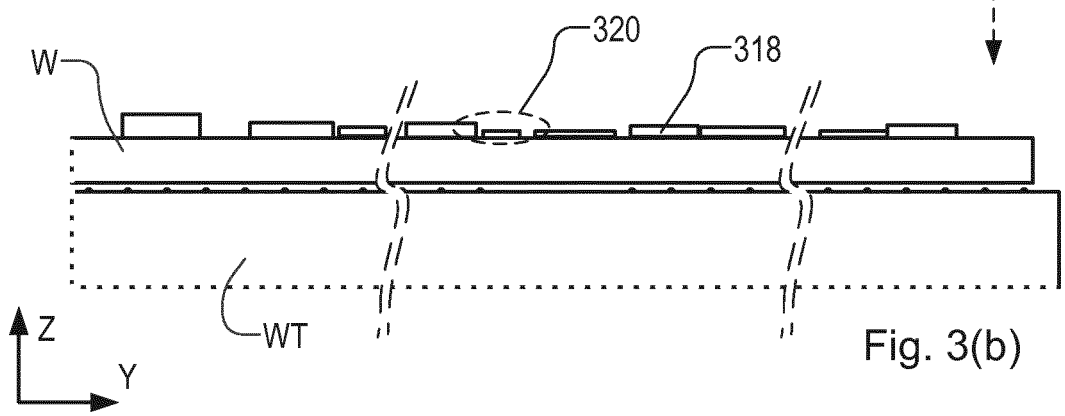
FIG. 3(b) illustrates schematically a detail of FIG. 3(a) showing various topographical variations on an example substrate in the lithographic apparatus of FIG. 1.

FIG. 3(b) is a detail of the region 316 of FIG. 3(a). It shows areas or patterns 318 of structures which have been formed on the substrate by a lithographic process. The patterns may have different relative heights, as shown (the heights are shown exaggerated relative to the substrate W). Also shown is a single measurement spot 320 from the source side optics LSS. In an embodiment, each specific area or different pattern 318 described by the layout information may be assumed to have a uniform height, and therefore assigned a uniform height value relative to the other areas described by the layout information. As such, the obtained higher resolution map may comprise only areas of uniform height (plateaus) having fixed boundaries defined by the layout information. Therefore, the entire substrate surface may be described in terms of a plurality of such plateaus, each plateau at a height determined by the level sensor measurements deconvolved with the known layout information. Alternatively, each area need not have a uniform height assigned to it. Any given height profile (for which a multiplication function is being sought) can work. It is also possible to determine an offset or multiple shapes per area, as long as the number of (overlapping) measurements is sufficient.

The different areas may comprise areas which differ in terms of pattern density, for example. It has been observed that, following polishing (e.g. a CMP step), each area of (approximately) uniform pattern density will tend to have a uniform height which is dependent on the pattern density. However, the low resolution measurements from the level sensor will tend to be smeared out, particularly at the boundaries of each area described by the layout information.

Figures 4A, 4B:
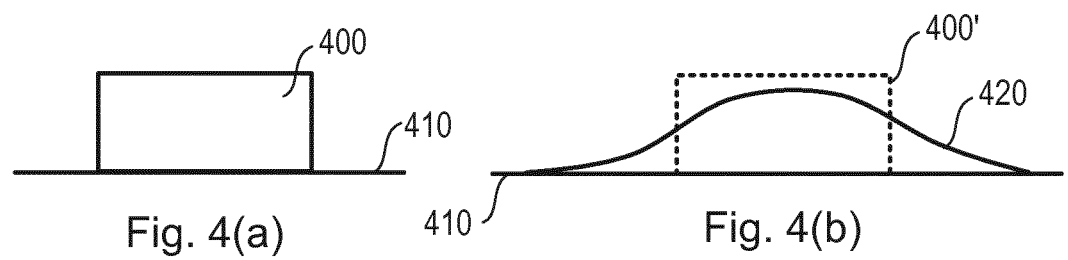
FIG. 4(a), FIG. 4(b), FIG. 4(c) and FIG. 4(d) illustrate a problem encountered when using a low resolution level sensor for high resolution surface topography measurement, with FIGS. 4(a) and 4(c) showing example actual profiles of a structure being measured and FIGS. 4(b) and 4(d) showing the profiles of FIGS. 4(a) and 4(c) respectively as measured by the level sensor.
Figures 4C, 4D:
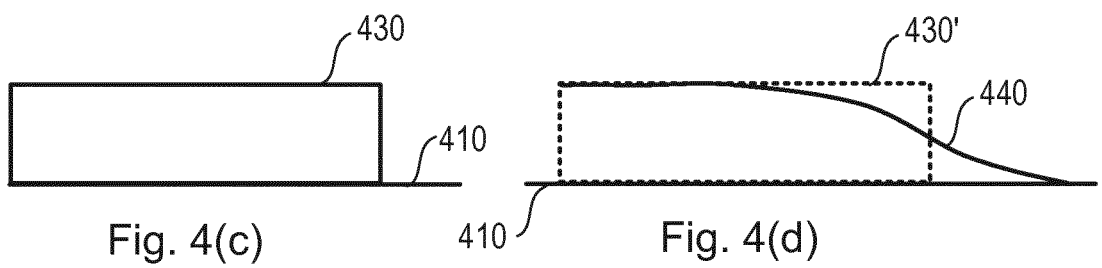

FIG. 4 illustrates the effect of the low resolution of the level sensor on height measurements. FIG. 4(a) shows a structure or pattern 400 on a substrate surface 410, having a width W less than 1 mm (e.g., between 100 μm and 1 mm). FIG. 4(b) shows a profile 420 approximating what the level sensor "sees" when measuring the height of pattern 400 (the pattern's actual shape 400' is shown dotted for comparison). This spreading of the topology of the actual pattern is because the level sensor's measurement spot size is not negligible compared to a dimension of the local topology being measured. FIGS. 4(c) and (d) illustrate a similar issue when the pattern is greater than 1 mm, with the level sensor unable to properly resolve the edge of pattern 430, such that it is spread or blurred in the measured profile 440 (the pattern's actual shape 430' is shown dotted for comparison).

Figure 5A:
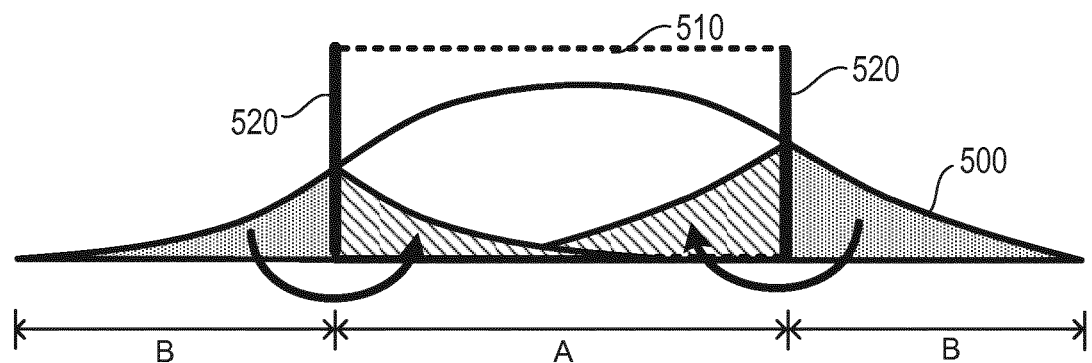
FIG. 5(a) is a conceptual illustration of an estimation algorithm for estimating the actual height of areas on a substrate, showing how height measurements outside a known area transition are reallocated inside the known area transition.
Figure 5B:
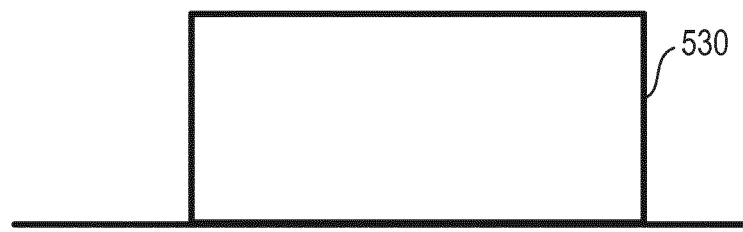
FIG. 5(b) schematically shows the resultant estimated height profile according to the algorithm of FIG. 5(a)

FIG. 5 conceptually illustrates how a deconvolution algorithm may operate in an embodiment. In FIG. 5(a), the measured (intensity) profile 500 is shown with the actual pattern profile 510 (actual topology-dotted) shown overlaid. The region of measured profile 500 corresponding to the actual pattern profile 510 is labelled A and the region of measured profile 500 outside of the actual pattern profile 510 is labelled B. Also shown is the location of known area transitions 520 from layout information. The profile at region B represents a height measurement actually resultant from the height level of the pattern 510 at region A. Therefore, the result of the low resolution of the level sensor is to average out the height of pattern 500 over a greater area (of width A+B) than the area (of width A) of the pattern 500. In doing this, the measured profile 510 takes the form of the point spread function of the level sensor's measurement spot.

In an embodiment, therefore, the algorithm assigns the height (intensity as measured at detector optics LSD) measured at area B to the area A using the known area transitions 520 delineating the area A. This is conceptually illustrated in FIG. 5(a), where, in an embodiment, the measured height of area B is added to the measured height within the area transitions 520, defined by the layout information (e.g., area A). In an embodiment, the algorithm will assign a uniform height to this area (area A), determined from a combination or deconvolution of the level sensor measurements and the layout information. This is represented by the estimated profile 530 in FIG. 5(b).

Figure 6:
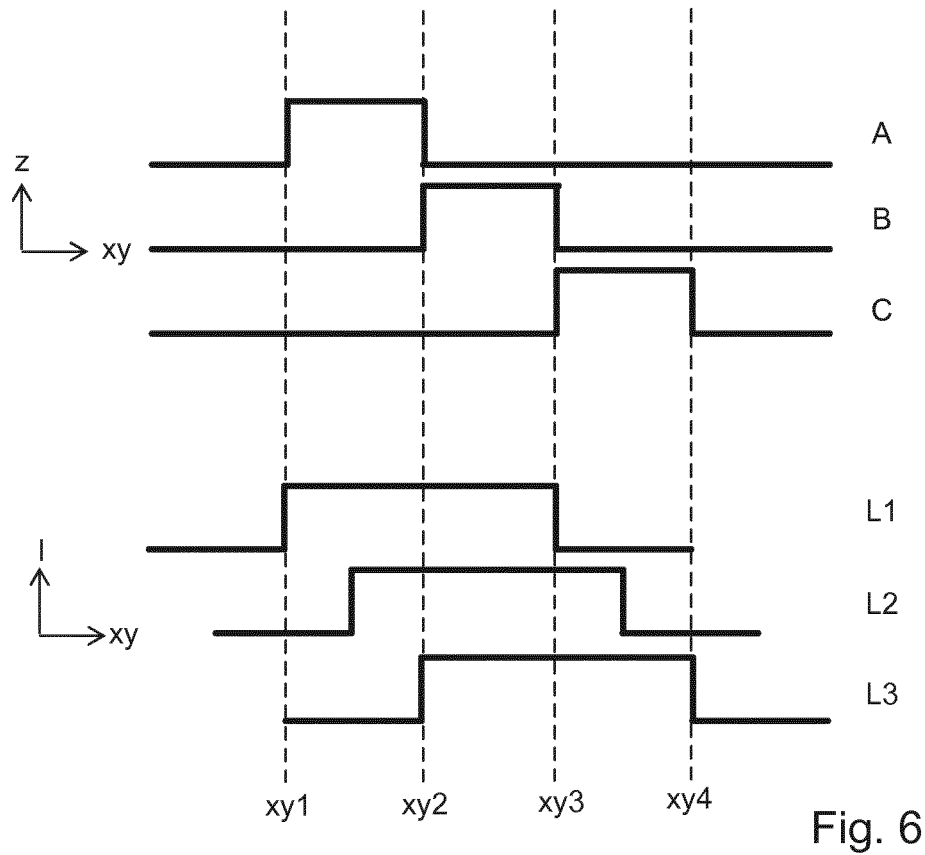
FIG. 6 is a further conceptual illustration of an estimation algorithm for estimating the actual height of areas on a substrate, showing (top) the topology being assumed and (bottom) three successive level sensor measurements shifted in XY.

FIG. 6 conceptually indicates how the algorithm may actually deconvolve the level sensor measurements according to an embodiment, where there are neighboring areas of different topology. The upper graph is a graph of topology of three neighboring areas, a first area having topology described by plot A, a second area having topology described by plot B and a third area having topology described by plot C. The lower graph is a graph of the corresponding level sensor measurements (spot profiles) L1, L2 and L3 (intensity against xy) in three different positions, with both graphs aligned in xy.

In such a simplified example, the level sensor measurements L1, L2 and L3 are deconvolved with the known area transitions xy1, xy2, xy3 and xy4, and the known topology as shown in the top graph. The topology is assumed to take the shapes shown in the graph, each with a multiplication factor which is determined by the deconvolution. As the level sensor footprint (response function or point spread function) is known, the magnitude of the multiplication factor can be found, in this example, as follows:

$$L1=a+b$$

$$L2=\tfrac{1}{2}a+b+\tfrac{1}{2}c$$

$$L3=b+c$$

where a, b and c are the multiplication factors being determined for the known profiles described by plots A, B and C respectively; and L1, L2 and L3 are the level sensor measurements. As can be seen, there are three unknowns and three equations, which means that the measurements can be deconvolved.

It will be appreciated that FIG. 6 is a simplified example. In particular, the level sensor measurements L1, L2, L3 may take any shape, and may in fact each comprise a three dimensional response function (height z against x and y), with the deconvolution re-apportioning regions of the function to areas in xy, according to the known layout information, in the manner described above.

Figure 7A:
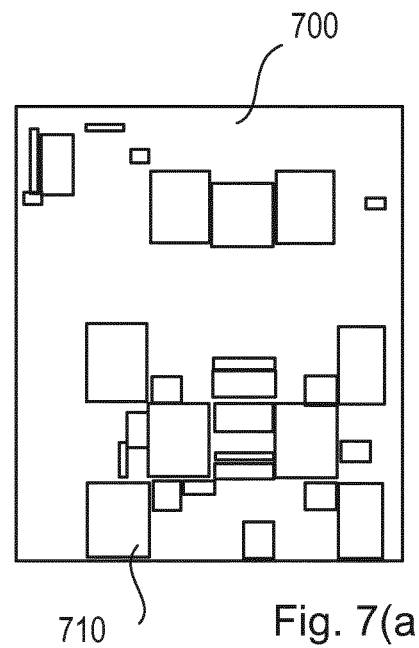
FIG. 7(a) illustrates schematically known layout information.
Figure 7B:
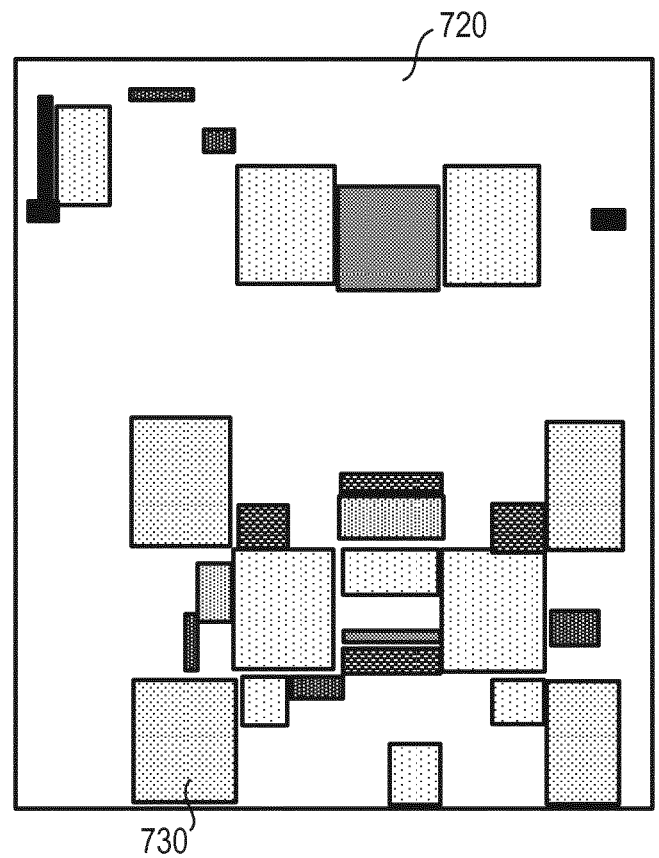
FIG. 7(b) illustrates schematically an estimated height profile from level sensor measurements and the known layout information of FIG. 7(a).

FIG. 7(a) shows an example of layout information 700 showing areas 710 for which different topology measurements are to be expected, e.g., areas having different pattern density. FIG. 7(b) shows the resultant estimated level sensor measurement 720 which uses this layout information 700. As can be seen in the estimated level sensor measurement 720, each different pattern or area 730 corresponding to an area 710 in the layout information 700 has had a uniform height assigned over that area (with different heights indicated by different shading).

In a further embodiment, the actual resolution of the level sensor measurements can be improved (e.g., effectively doubled) by using a stitching method. Such a stitching method may comprise measuring the substrate with the level sensor twice, with the measurements shifted by (approximately) half the level sensor resolution (e.g., half the distance between measurement spots on the substrate). For example, a level sensor may have 1 mm resolution (e.g., comprise a plurality of measurement spots 1 mm apart). The level sensor may measure a substrate once, and then again with a 0.5 mm shift between measurements. These measurements can then be stitched together, effectively doubling the resolution. Consequently, it is proposed that the actual level sensor measurements used the methods disclosed herein comprise such stitched measurements. A similar stitching method can be performed in the perpendicular direction, where deconvolution is being performed in X and Y.

The disclosed methods describe a method for predicting topology of product substrates using both level sensor measurements, product layout information, and guided fit algorithms. Such methods enable better prediction capability of focus related defects, enable a very quick measurement of topography, and can be non-destructive without causing process dependency.

As already described, the level sensor system is used to determine a height map of a substrate. The exposure slit of a lithographic apparatus is leveled based on (e.g., a least squares or similar) optimization based on many local level sensor spot heights. A single height correction will then be applied, as given by an on-product focus-exposure matrix (FEM) of a focus anchor feature (machine focus vs product focus offset). The use of a single offset may be non-optimal because:

It may be that the chosen focus anchor feature is not the most focus critical feature;

The most focus critical feature may be located at different local topology heights throughout the die (field);

There may be multiple focus critical features within a die, each one of which is the most focus critical locally;

Which is the most focus critical feature also depends on the local defocus (value or map) experienced by the die exposure.

Current topology related height offsets may be in the order of 10-15 nm. This is considerable with respect to a total focus budget of +/−25 nm. As a consequence of the level sensor determining only an "average" focus level, there is a risk that focus critical features are positioned out of focus. High resolution topography measurements may therefore improve focus control. However, the level sensor cannot perform high resolution topography measurements due to its spot size, as already explained.

It is therefore proposed to perform high resolution topography measurements, and more specifically intra-die topography measurements performed by a suitable high resolution metrology device, and incorporate the high resolution topography measurement data with the level sensor measurement data. The resultant resolution topography measurement data will comprise the knowledge relating to intra-die topology. A suitable high resolution metrology device may be, for example, an electron beam (e-beam) metrology device.

The high resolution metrology device used to perform the high resolution topography measurements should be very stable over time and movement in the XY plane, in order that the resulting topology map is sufficiently accurate. However, in absolute terms this will never be sufficiently accurate in practice. Therefore it is proposed to make the high resolution topography measurement relative. This may be achieved by performing a high resolution topology measurement (using for example an e-beam metrology device) referenced to another sensor which also performs a (lower resolution) reference topology measurement. This may comprise performing the high resolution topography measurement and reference topology measurement simultaneously on a substrate in a high resolution metrology calibration step. In an embodiment, this high resolution metrology calibration step is performed for a single die. In an embodiment, the high resolution metrology calibration step may be performed only once per product layer.

The high resolution topology measurement data can then be stored and added to a level sensor height map in order to construct a high resolution height map which may be used to improve focus control in a lithographic process. The improved focus control may comprise determining and applying a weighting (e.g., a local weight map) between product features (e.g. an inverse depth of focus per feature) based on the high resolution topography data.

In an embodiment, the reference for the relative measurements may be a gas (e.g., air) gauge of a lithographic apparatus (a gas pressure differential level sensor). The gas gauge may be used as a reference for the level sensor measurements. The gas gauge relies on detecting a pressure difference between a reference gas flow and a gas flow onto the surface being measured. As such, a gas gauge measurement does not suffer from optical dependency (i.e., measurement variation correlated with e.g., different product properties such as material types and densities) in the way that an optical level sensor measurement (based on radiation reflection) does. However, gas gauge measurements are relatively slow compared to optical level sensor measurements. Therefore, the level sensor is referenced once to the gas gauge in a level sensor to gas gauge calibration step, to obtain a per-field correction which is then applied to all subsequent level sensor measurements, for example:

$$LS'(x,y)=LS(x,y)-(LS-AG)_{field} \quad (1)$$

where LS(x,y) is the level sensor measurement, $(LS-AG)_{field}$ is the per-field correction determined (as the difference between simultaneous level sensor measurements LS and gas gauge measurements AG) in the level sensor to gas gauge calibration step, and LS'(x,y) is the corrected level sensor measurement. As can be seen, the corrected level sensor measurement LS'(x,y) is equivalent to the topography as would be measured using a gas gauge.

In an embodiment, where the high resolution topology data is provided by an e-beam metrology device, the gas gauge spot center is located on top of the e-beam measurement for the high resolution metrology calibration. If this is not possible then, depending on what is possible, another reference arrangement may be used. For example an arrangement where two gas gauge spots are located either side of the e-beam spot (in X or Y) may be used. In such an embodiment, the high resolution topology map may be referred to as an overlapping gas gauge and e-beam position, with the overlapping twin gas gauge measurements matched to correct for a 'time' drift. Alternatively a single shifted (with respect to the e-beam) gas gauge spot and a fiducial plate may be used in a similar manner.

In an embodiment where the high resolution topology measurement is referenced to the gas gauge, the high resolution level sensor measurements LS' $(x,y)_{HR}$ may comprise:

$$LS'(x,y)_{HR}=LS(x,y)-(LS-AG)_{field}-(AG-T_{HR})_{die} \quad (2)$$

where $(AG-T_{HR})_{die}$ is the per-die correction determined (as the difference between the gas gauge measurements AG and the high resolution topography measurements $T_{HR}$) in the high resolution metrology calibration step.

In an embodiment, the high resolution topography measurement may be referenced to the level sensor. In such an embodiment, the high resolution level sensor measurements $LS'(x,y)_{HR}$ may comprise:

$$LS'(x,y)_{HR}=LS(x,y)-(LS-T_{HR})_{die} \quad (3)$$

where $(LS-T_{HR})_{die}$ is the per-die correction determined (as the difference between the level sensor measurements LS and the high resolution topography measurements $T_{HR}$) in the high resolution metrology calibration step.

In an embodiment, the earlier described methods of combining (e.g., deconvolving) measured (e.g., level sensor) topography data with knowledge of positional information of one or more patterns may be used to provide a first coarse focus map in an initial step prior to the high resolution metrology calibration step. In such an embodiment, it may be that the high resolution metrology calibration step is not performed across the entire die. Instead, the first coarse focus map is used to identify the areas on the die for which the relatively expensive (e.g., in terms of time) high resolution topology measurements should be performed (e.g., areas with significant topological variation and/or which comprise focus critical structures).

While the above examples are provided in terms of focus control using level sensor measurements, the concept has greater application. Broadly stated, the methods described herein may be used to measure variation of a physical parameter (e.g., a pattern shift error (e.g., overlay, edge placement error), critical dimension (CD) as well as topography). First measurement data of variation of the physical parameter across the substrate may be obtained. Also, second measurement data may be obtained, wherein the second measurement data comprises intra-die measurement data of higher resolution than the first measurement data, and wherein the second measurement data is referenced to reference measurement data having a common frame of reference with the first measurement data. As before, the first measurement data and the second measurement data may be combined to obtain derived measurement data having a resolution greater than the resolution of the first measurement data. In particular, the basic concepts can be extended to overlay or CD control.

For overlay control, the lower resolution measurement (first measurement data) over the full substrate may comprise measurement of alignment targets by an alignment sensor (e.g., alignment sensor AS in FIG. 1). The alignment sensor may be referenced to overlay or other metrology targets as measured by a metrology device such as a scatterometer metrology device in an alignment calibration step. The high resolution measurement data (second measurement data) in this embodiment may comprise an intra-die high resolution measurement of pattern shift (overlay). The high resolution measurement of pattern shift may be referenced to either the alignment targets or overlay/metrology targets (measurement of which provides reference measurement data) in a high resolution metrology calibration step. The high resolution metrology calibration step may comprise performing simultaneous measurement of the high resolution measurement of pattern shift (e.g., using an e-beam metrology device) and measurement of the alignment targets (e.g., using an alignment sensor) or overlay/metrology targets (e.g., using a scatterometer based metrology device). The intra-die high resolution measurement of pattern shift can be combined with the full substrate measurement of the alignment or overlay/metrology targets and used in an overlay process control loop.

Similarly for CD control, the lower resolution measurement (first measurement data) across the full substrate may comprise measurement of CD targets by a metrology device such as a scatterometer metrology device. The measurements of CD targets may be referenced to a CD-SEM (scanning electron microscope) measurement in a CD calibration step. The high resolution measurement data (second measurement data) in this embodiment may comprise an intra-die high resolution CD measurement. The high resolution CD measurement may be referenced to the CD targets (measurement of which provides reference measurement data) in a high resolution metrology calibration step. The high resolution metrology calibration step may comprise performing simultaneous measurement of the high resolution CD measurement (e.g., using an e-beam metrology device) and measurement of the CD targets (e.g., using a scatterometer based metrology device). The intra-die high resolution CD measurement can be combined with the full substrate measurement of the CD targets and used in a CD process control loop.

In all of these embodiments, the high resolution measurement data (second measurement data) may relate to a full set of measurement locations relative to the lower resolution measurement data (first measurement data), or alternatively relate to only a sparse subset of measurement locations relative to the lower resolution measurement data. For example high resolution measurements may optionally be made only at locations of features known to be critical or of having deviating height. Alternatively, or in addition, the high resolution measurements may comprise only one measurement per area, or measurement of one or only a few features within a larger set of features.

Numerous further variations of the above examples can be envisaged within the scope of the present disclosure.

Further embodiments of the invention are disclosed in the numbered clauses below:

1. A method of determining topographical variation across a substrate on which one or more patterns have been applied, the method comprising:

obtaining measured topography data representing a topographical variation across the substrate on which one or more patterns have been applied by a lithographic process; and combining the measured topography data with knowledge relating to intra-die topology to obtain derived topography data having a resolution greater than the resolution of the measured topography data.

2. The method of clause 1, wherein the knowledge relating to intra-die topology comprises positional information of the one or more patterns.

3. The method of clause 2, wherein the combining comprises deconvolving the measured topography data with the positional information.

4. The method of clause 3, wherein the deconvolving the measured topography data with positional information comprises determining a uniform height value for each area occupied by one of the one or more patterns.

5. The method of clause 4, wherein the deconvolving the measured topography data with positional information comprises delineating each area of uniform height using pattern transitions defined by the positional information of the one or more patterns.

6. The method of clause 4 or clause 5, wherein the deconvolving the measured topography data with positional information comprises deconvolving a level sensor response function with the positional information of the one or more patterns.

7. The method of clause 6, wherein the measured topography data comprises individual level sensor response functions which spatially overlap; and the deconvolving the measured topography data with positional information comprises simultaneously solving for the uniform height values from the overlapping level sensor response functions corresponding to an area of the substrate being measured.

8. The method of any of clauses 3 to 7, wherein the deconvolving the measured topography data with positional information is performed in one dimension.

9. The method of any of clauses 3 to 7, wherein the deconvolving the measured topography data with positional information is performed in two dimensions.

10. The method of any of clauses 2 to 9, wherein the measured topography data is obtained from measurements of the substrate performed after a polishing step on the substrate.

11. The method of any of clauses 2 to 10, wherein the one or more patterns are each differentiated according to a pattern density.

12. The method of any of clauses 2 to 11, wherein the positional information of the one or more patterns is obtained from a reticle data file used to apply a pattern to a reticle.

13. The method of any of clauses 1 to 12, wherein the knowledge relating to intra-die topology comprises high resolution topography measurement data referenced to reference topography data wherein the reference topography data has a common frame of reference with the measured topography data.

14. The method of clause 13, wherein the high resolution topography measurement data is obtained in a calibration step comprising simultaneously performing a high resolution topography measurement and a reference topography measurement to obtain the high resolution topography measurement data referenced to the reference topography data.

15. The method of clause 14, wherein the high resolution topography measurement is performed using an electron beam metrology device.

16. The method of clause 14 or clause 15, wherein the reference topography measurement is performed using an optical level sensor.

17. The method of clause 14 or clause 15, wherein the reference topography measurement is performed using a gas pressure differential level sensor.

18. The method of any of clauses 13 to 17, comprising determining a weighting between product features for a focus control process correction based on the combination of the measured topography data and the high resolution topography data.

19. The method of any of clauses 1 to 18, comprising measuring the substrate with an optical level sensor to obtain the measured topography data.

20. The method of clause 19, wherein the optical level sensor measures the substrate at a plurality of measurement spots in a single capture, and comprising performing overlapping measurements with a separation smaller than the separation between adjacent measurement spots.

21. The method of clause 19 or clause 20, wherein the optical level sensor is an ultraviolet optical level sensor which uses ultraviolet radiation to measure the substrate.

22. The method of any of clauses 1 to 18, comprising measuring the substrate with a gas pressure differential level sensor to obtain the measured topography data.

23. A level sensor apparatus comprising:

a first measurement system operable to measure topographical variation across a substrate on which one or more patterns have been applied to obtain measured topography data; and a processor system configured to combine the measured topography data with knowledge relating to intra-die topology to obtain derived topography data having a resolution greater than that of the first measurement system.

24. The level sensing apparatus of clause 23, wherein the knowledge relating to intra-die topology comprises positional information of the one or more patterns.

25. The level sensing apparatus of clause 24, wherein the processor system is configured to deconvolve the measured topography data with the positional information.

26. The level sensing apparatus of clause 25, wherein the processor system is configured to determine a uniform height value for each area occupied by one of the one or more patterns.

27. The level sensing apparatus of any of clauses 24 to 26, wherein the processor system is configured to delineate each area of uniform height using pattern transitions defined by the positional information of the one or more patterns.

28. The level sensing apparatus of any of clauses 24 to 27, wherein the processor system is configured to deconvolve a level sensor response function with the positional information of the one or more patterns.

29. The level sensing apparatus of clause 28, wherein the measured topography data comprises individual level sensor response functions which spatially overlap; and the processor system is configured to simultaneously solve for the uniform height values from the overlapping level sensor response functions corresponding to an area of the substrate being measured.

30. The level sensing apparatus of any of clauses 24 to 29, wherein the processor system is configured to differentiate the one or more patterns according to a pattern density.

31. The level sensing apparatus of any of clauses 24 to 30, configured to obtain the positional information of the one or more patterns from a reticle data file used to apply a pattern to a reticle.

32. The level sensing apparatus of any of clauses 23 to 31, wherein the knowledge relating to intra-die topology comprises previously performed high resolution topography measurement data referenced to reference topography data having a common frame of reference with the first measurement system.

33. The level sensing apparatus of clause 32, comprising a second measurement system, wherein the second measurement system and the first measurement system are simultaneously operable to perform a high resolution topography measurement and a reference topology measurement respectively to obtain the high resolution topography measurement data referenced to the reference topography data.

34. The level sensing apparatus of clause 33, wherein the second measurement system comprises an electron beam metrology device.

35. The level sensing apparatus of any of clauses 32 to 34, wherein the processor system is configured to determine a weighting between product features for a focus control process correction based on the combination of the measured topography data and the high resolution topography data.

36. The level sensing apparatus of any of clauses 23 to 35, wherein the first measurement system is an optical level sensor system.

37. The level sensing apparatus of clause 36, wherein the optical level sensor system is configured to measure the substrate at a plurality of measurement spots in a single capture, and perform overlapping measurements with a separation smaller than the separation between adjacent measurement spots.

38. The level sensing apparatus of clause 36 or clause 37, comprising a radiation source operable to provide ultraviolet radiation to measure the substrate.

39. The level sensing apparatus of any of clauses 23 to 35, wherein the first measurement system is a gas pressure differential first measurement system.

40. A lithographic apparatus comprising a level sensor apparatus according to any of clauses 23 to 39.

41. The lithographic apparatus of clause 40, further comprising;

projection optics configured to transfer a pattern to a substrate; and a substrate table configured to hold a substrate in a position/and or orientation measured in relation to the projection optics.

41. A method comprising:

obtaining first measurement data of variation of a physical parameter across a substrate on which one or more patterns have been applied by a lithographic process;

obtaining second measurement data, wherein the second measurement data comprises intra-die measurement data of higher resolution than the first measurement data, and wherein the second measurement data is referenced to reference measurement data having a common frame of reference with the first measurement data; and combining the first measurement data with the second measurement data to obtain derived measurement data having a resolution greater than the resolution of the first measurement data.

42. The method of clause 41, wherein the first measurement data is measured using a first metrology tool and the second measurement data is measured using a second metrology tool.

43. The method of clause 42, wherein the second metrology tool is an electron beam metrology tool.

44. The method of clause 42 or clause 43, comprising performing a calibration which comprises simultaneously measuring a portion of a substrate using respectively the second metrology tool and a reference metrology tool being the same as and/or having a common frame of reference with the first metrology tool.

45. The method of clause 44, wherein the physical parameter is topography and the first metrology tool comprises a level sensor apparatus.

46. The method of clause 45, wherein the level sensor apparatus is an optical level sensor apparatus and the common frame of reference is to that of a gas pressure differential level sensor apparatus to which the optical level sensor apparatus is referenced.

47. The method of clause 46, wherein the reference metrology tool comprises the gas pressure differential level sensor apparatus.

48. The method of clause 44, wherein the physical parameter is a pattern shift error and the first metrology tool comprises an alignment sensor apparatus and the common frame of reference is to that of an overlay metrology apparatus to which the alignment sensor apparatus is referenced.

49. The method of clause 48, wherein the reference metrology tool comprises the alignment sensor apparatus or an overlay metrology apparatus.

50. The method of clause 44, wherein the physical parameter is critical dimension or other parameter relating to size of a structure, and the first metrology tool comprises a first CD metrology apparatus and the common frame of reference is to that of a second CD metrology apparatus to which the first CD metrology apparatus is referenced.

51. The method of clause 50, wherein the first CD metrology apparatus comprises a scatterometer based metrology apparatus and the second CD metrology apparatus comprises a scanning electron microscope.

52. The method of clause 51, wherein the reference metrology tool comprises the scatterometer based metrology apparatus.

53. A computer program product comprising machine readable instructions for causing a general purpose data processing apparatus to perform a method according to any of clauses 1 to 22 or clauses 41 to 52.

54. A method of determining topographical variation across a substrate on which one or more patterns have been applied, the method comprising;

obtaining positional information of the one or more patterns;

obtaining measured topography data representing a topographical variation across the substrate on which one or more patterns have been applied by a lithographic process, and deconvolving the measured topography data with the positional information to obtain derived topography data having a resolution greater than the resolution of the measured topography data.

55. The method of claim 54, wherein the deconvolving the measured topography data with positional information comprises determining a uniform height value for each area occupied by one of the one or more patterns.

56. The method of claim 55, wherein the deconvolving the measured topography data with positional information comprises delineating each area of uniform height using pattern transitions defined by the positional information of the one or more patterns.

57. The method of claim 56, wherein the deconvolving the measured topography data with positional information comprises deconvolving a level sensor response function with the positional information of the one or more patterns.

58. The method of claim 57, wherein the measured topography data comprises individual level sensor response functions which spatially overlap; and the deconvolving the measured topography data with positional information comprises simultaneously solving for the uniform height values from the overlapping level sensor response functions corresponding to an area of the substrate being measured.

59. The method of claim 54, wherein the one or more patterns are each differentiated according to a pattern density.

60. The method of claim 54, wherein the positional information of the one or more patterns is obtained from a reticle data file used to apply a pattern to a reticle.

61. The method of claim 54, wherein the positional information comprises high resolution topography measurement data referenced to reference topography data wherein the reference topography data has a common frame of reference with the measured topography data.

62. The method of claim 61, wherein the high resolution topography measurement data is obtained in a calibration step comprising simultaneously performing a high resolution topography measurement and a reference topography measurement to obtain the high resolution topography measurement data referenced to the reference topography data.

63. The method of claim 62, wherein the high resolution topography measurement is performed using an electron beam metrology device.

64. The method of claim 62, wherein the reference topography measurement is performed using an optical level sensor.

65. The method of claim 62, wherein the reference topography measurement is performed using a gas pressure differential level sensor.

66. The method of claim 61, comprising determining a weighting between product features for a focus control process correction based on the combination of the measured topography data and the high resolution topography data.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin film magnetic heads, etc.

An embodiment may include a computer program containing one or more sequences of machine-readable instructions to cause performance of one or more steps of a method herein. The computer program may be executed for example within unit SCS in the apparatus of FIG. 2 and/or the control unit LACU of FIGS. 2 and 3. There may also be provided a data storage medium (e.g., semiconductor memory, magnetic or optical disk) having such a computer program stored therein. Where an existing apparatus, for example of the type shown in FIGS. 2 and/or 3, is already in production and/or in use, an embodiment can be implemented by the provision of updated computer program products for causing a processor system to perform all or part of the methods herein. The program may optionally be arranged to control one or more parts of the apparatus and/or process presented in relation to FIGS. 2 and/or 3.

Although specific reference may have been made above to the use of embodiments in the context of optical lithography, it will be appreciated that embodiments may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The descriptions above are intended to be illustrative, not limiting. Thus, it will be apparent to one skilled in the art that modifications may be made to the invention as described without departing from the spirit and scope of the claims set out below. In addition, it should be appreciated that structural features or method steps shown or described in any one embodiment herein can be used in other embodiments as well.

The invention claimed is:

1. A method comprising:
    obtaining first measurement data of variation of a physical parameter across a substrate on which one or more patterns have been applied by a lithographic process;
    obtaining second measurement data, wherein the second measurement data comprises intra-die measurement data of higher resolution than the first measurement data, and wherein the second measurement data is referenced to reference measurement data, the reference measurement data separate from the first measurement data and the reference measurement data having a common frame of reference with the first measurement data; and
    combining, by a hardware computer system, the first measurement data with the second measurement data to obtain derived measurement data having a resolution greater than the resolution of the first measurement data.

2. The method of claim 1, wherein the first measurement data is measured using a first metrology tool and the second measurement data is measured using a second metrology tool.

3. The method of claim 2, further comprising performing a calibration which comprises simultaneously measuring a portion of a substrate using respectively the second metrology tool and a reference metrology tool being the same as and/or having a common frame of reference with the first metrology tool.

4. The method of claim 2, wherein the physical parameter is topography, wherein the first metrology tool comprises an optical level sensor apparatus and wherein the common frame of reference is to that of a gas pressure differential level sensor apparatus to which the optical level sensor apparatus is referenced.

5. The method of claim 4, wherein the reference metrology tool comprises the gas pressure differential level sensor apparatus.

6. The method of claim 2, wherein the second metrology tool is an electron beam metrology tool.

7. The method of claim 2, wherein the physical parameter is a pattern shift error and the first metrology tool comprises an alignment sensor apparatus and the common frame of reference is to that of an overlay metrology apparatus to which the alignment sensor apparatus is referenced.

8. The method of claim 7, wherein the reference metrology tool comprises the alignment sensor apparatus or an overlay metrology apparatus.

9. The method of claim 2, wherein the physical parameter is critical dimension or other parameter relating to size of a structure, and the first metrology tool comprises a first critical dimension (CD) metrology apparatus and the common frame of reference is to that of a second CD metrology apparatus to which the first CD metrology apparatus is referenced.

10. The method of claim 9, wherein the first CD metrology apparatus comprises a scatterometer based metrology apparatus and the second CD metrology apparatus comprises a scanning electron microscope.

11. The method of claim 10, wherein the reference metrology tool comprises the scatterometer based metrology apparatus.

12. A computer program product comprising a non-transitory computer-readable medium having instructions therein, the instructions, upon execution by a computer system, configured to cause the computer system to at least:
obtain first measurement data of variation of a physical parameter across a substrate on which one or more patterns have been applied by a lithographic process;
obtain second measurement data, wherein the second measurement data comprises intra-die measurement data of higher resolution than the first measurement data, and wherein the second measurement data is referenced to reference measurement data, the reference measurement data separate from the first measurement data and the reference measurement data having a common frame of reference with the first measurement data; and
combine the first measurement data with the second measurement data to obtain derived measurement data having a resolution greater than the resolution of the first measurement data.

13. The computer program product of claim 12, wherein the first measurement data is measured using a first metrology tool and the second measurement data is measured using a second metrology tool.

14. The computer program product of claim 13, wherein the instructions are further configured to cause the computer system to perform a calibration which uses a simultaneous measurement of a portion of a substrate using respectively the second metrology tool and a reference metrology tool being the same as and/or having a common frame of reference with the first metrology tool.

15. The computer program product of claim 13, wherein the physical parameter is topography, wherein the first metrology tool comprises an optical level sensor apparatus and wherein the common frame of reference is to that of a gas pressure differential level sensor apparatus to which the optical level sensor apparatus is referenced.

16. The computer program product of claim 13, wherein the physical parameter is a pattern shift error and the first metrology tool comprises an alignment sensor apparatus and the common frame of reference is to that of an overlay metrology apparatus to which the alignment sensor apparatus is referenced.

17. A computer program product comprising a non-transitory computer-readable medium having instructions therein, the instructions, upon execution by a computer system, configured to cause the computer system to at least:
obtain first measurement data of variation of a physical parameter across a substrate on which one or more patterns have been applied by a lithographic process;
obtain second measurement data, wherein the second measurement data comprises intra-die measurement data of higher resolution than the first measurement data, and wherein the second measurement data is referenced to reference measurement data having a common frame of reference with the first measurement data; and
combine the first measurement data with the second measurement data to obtain derived measurement data having a resolution greater than the resolution of the first measurement data, the derived measurement data being values of the first measurement data modified to new values by the second measurement data or being values of the second measurement data modified to new values by the first measurement data.

18. The computer program product of claim 17, wherein the first measurement data is measured using a first metrology tool and the second measurement data is measured using a second metrology tool.

19. The computer program product of claim 18, wherein the instructions are further configured to cause the computer system to perform a calibration which uses a simultaneous measurement of a portion of a substrate using respectively the second metrology tool and a reference metrology tool being the same as and/or having a common frame of reference with the first metrology tool.

20. The computer program product of claim 18, wherein the physical parameter is topography, wherein the first metrology tool comprises an optical level sensor apparatus and wherein the common frame of reference is to that of a gas pressure differential level sensor apparatus to which the optical level sensor apparatus is referenced.

* * * * *